United States Patent
Braun

(10) Patent No.: US 10,147,484 B1
(45) Date of Patent: Dec. 4, 2018

(54) INVERTING PHASE MODE LOGIC GATES

(71) Applicant: Alexander Louis Braun, Baltimore, MD (US)

(72) Inventor: Alexander Louis Braun, Baltimore, MD (US)

(73) Assignee: NORTHRUP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 15/810,954

(22) Filed: Nov. 13, 2017

(51) Int. Cl.
*H03K 19/195* (2006.01)
*G11C 11/44* (2006.01)
*H03K 3/38* (2006.01)

(52) U.S. Cl.
CPC .............. *G11C 11/44* (2013.01); *H03K 3/38* (2013.01); *H03K 19/195* (2013.01)

(58) Field of Classification Search
CPC ......... H03K 19/195; H03K 3/38; G11C 11/44
USPC ............................................................ 326/3
See application file for complete search history.

(56) References Cited

U.S. PATENT DOCUMENTS

| | | | |
|---|---|---|---|
| 3,094,685 A | 6/1963 | Crowe | |
| 4,956,642 A | 9/1990 | Harada | |
| 5,233,243 A * | 8/1993 | Murphy | ............. H03K 19/1954 326/4 |
| 6,310,488 B1 | 10/2001 | Hasegawa et al. | |
| 6,608,518 B2 | 8/2003 | Furuta et al. | |
| 6,734,699 B1 * | 5/2004 | Herr | ................... H03K 19/1952 326/1 |
| 6,756,925 B1 | 6/2004 | Leung et al. | |
| 7,129,869 B2 | 10/2006 | Furuta et al. | |
| 7,227,480 B2 | 6/2007 | Furuta et al. | |
| 7,724,020 B2 | 5/2010 | Herr | |
| 7,786,748 B1 * | 8/2010 | Herr | ................... H03K 19/1952 326/3 |
| 7,903,456 B2 | 3/2011 | Kirichenko et al. | |
| 7,944,253 B1 | 5/2011 | Kirichenko | |
| 7,969,178 B2 | 6/2011 | Przybysz et al. | |

(Continued)

OTHER PUBLICATIONS

Likharev, K.K. et al.: "RSFQ Logic/Memory Family: A New Josephson-Junction Technology for Sub-Terahertz-Clock-Frequency Digital Systems," IEEE Transactions on Applied Superconductivity, vol. 1 No. 1, Mar. 1991.

(Continued)

*Primary Examiner* — Don Le
(74) *Attorney, Agent, or Firm* — Tarolli, Sundheim, Covell, & Tummino LLP

(57) ABSTRACT

An inverting reciprocal quantum logic (RQL) gate circuit has an input stage having a logical input asserted based on receiving a positive single flux quantum (SFQ) pulse and an output stage comprising phase mode logic (PML) inverter circuitry. The input stage includes one or more storage loops, at least one being associated with each logical input, each comprising an input Josephson junction (JJ), a storage inductor, and a logical decision JJ, the logical decision JJ being common to all the storage loops associated with the logical inputs and being configured to trigger based on biasing provided by one or more currents stored in the storage loops and a first bias signal provided to the input stage. The output stage de-asserts an output and is provided with a second bias signal having a second state opposite of a first state of the first bias signal.

20 Claims, 7 Drawing Sheets

(56) References Cited

U.S. PATENT DOCUMENTS

| | | |
|---|---|---|
| 7,977,964 B2 | 7/2011 | Herr |
| 8,138,784 B2 | 3/2012 | Przybysz et al. |
| 8,489,163 B2 | 7/2013 | Herr et al. |
| 8,611,974 B2 | 12/2013 | Maibaum et al. |
| 9,455,707 B2 | 9/2016 | Herr et al. |
| 9,543,959 B1 | 1/2017 | Carmean et al. |
| 9,595,970 B1 | 3/2017 | Reohr et al. |
| 9,646,682 B1 | 5/2017 | Miller et al. |
| 9,712,172 B2 | 7/2017 | Shauck et al. |
| 9,780,765 B2 | 10/2017 | Naaman et al. |
| 9,812,192 B1 | 11/2017 | Burnett et al. |
| 9,876,505 B1 | 1/2018 | Dai et al. |
| 9,887,700 B2 | 2/2018 | Carmean et al. |
| 9,905,900 B2 | 2/2018 | Herr et al. |
| 9,917,580 B2 | 3/2018 | Naaman |
| 9,972,380 B2 | 5/2018 | Ambrose |
| 2003/0011398 A1* | 1/2003 | Herr .................. H03K 19/1954 326/3 |
| 2003/0016069 A1* | 1/2003 | Furuta .................. B82Y 10/00 327/367 |
| 2009/0153180 A1 | 6/2009 | Herr |
| 2011/0133770 A1 | 6/2011 | Przybysz et al. |
| 2016/0164505 A1 | 6/2016 | Naaman et al. |
| 2017/0359072 A1* | 12/2017 | Hamilton ............... H03K 19/21 |

OTHER PUBLICATIONS

U.S. Office Action corresponding to U.S. Appl. No. 15/886,652, dated May 24, 2018.

\* cited by examiner

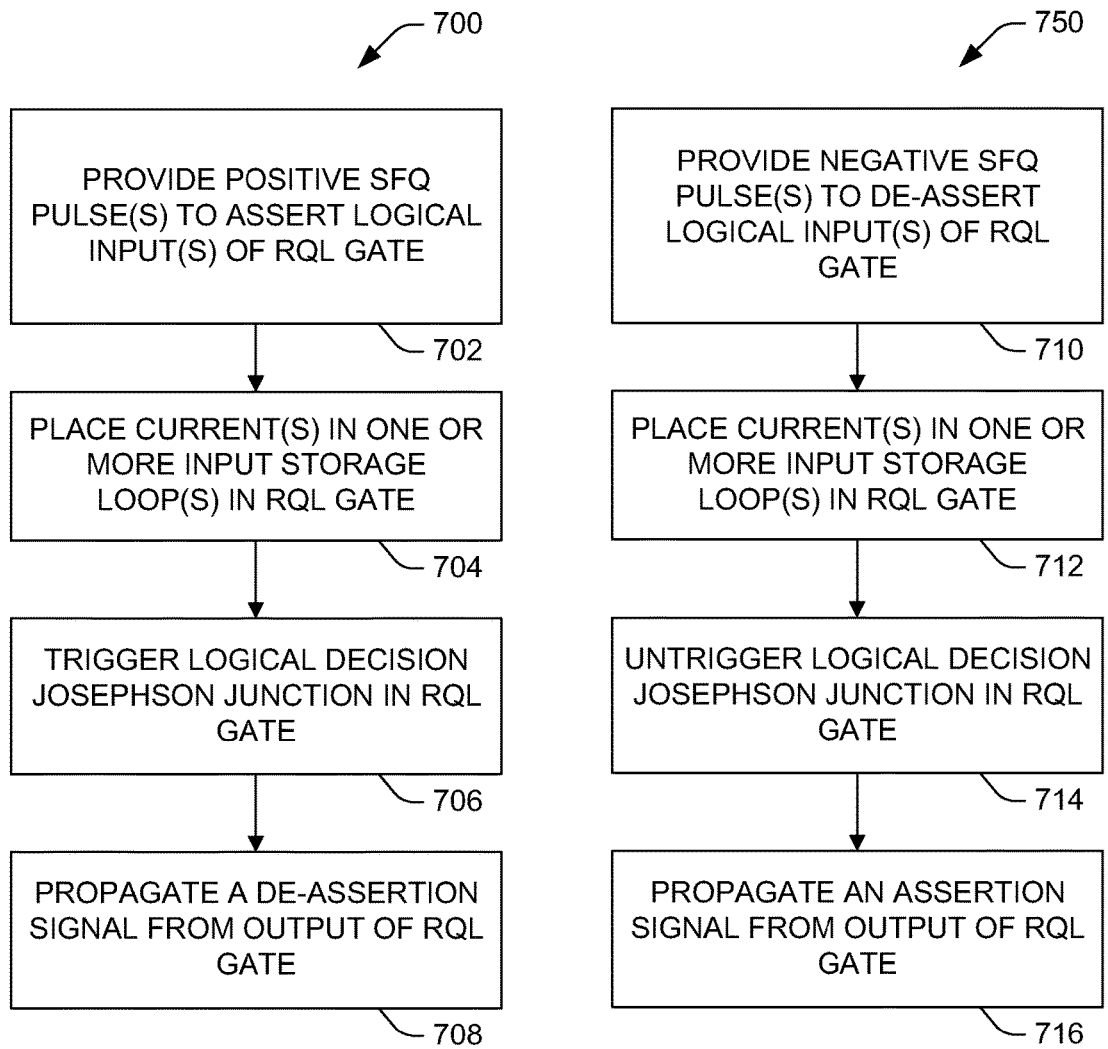

INVERTING PHASE MODE LOGIC GATES

TECHNICAL FIELD

The present invention relates generally to quantum and classical digital superconducting circuits, and specifically to inverting phase mode logic (PML) gates.

BACKGROUND

In the field of digital logic, extensive use is made of well known and highly developed complimentary metal-oxide semiconductor (CMOS) technology. As CMOS has begun to approach maturity as a technology, there is an interest in alternatives that may lead to higher performance in terms of speed, power dissipation computational density, interconnect bandwidth, and the like. An alternative to CMOS technology comprises superconductor based single flux quantum circuitry, utilizing superconducting Josephson junctions (JJs), with typical signal power of around 4 nanowatts (nW), at a typical data rate of 20 gigabits per second (Gb/s) or greater, and operating temperatures of around 4 kelvins.

A majority gate is a logical gate that returns true if and only if more than 50% of its inputs are true. A flip-flop is a bistable multivibrator, a two-stable-state circuit that can therefore be used to store state information and to change state by signals applied to one or more control inputs. In modern computing and communications electronics, flip-flops are the basic storage element in sequential logic. A conventional D flip-flop, e.g., one implemented in CMOS, has two binary inputs, a data input D and a clock input, and at least one output, Q. The D flip-flop captures the value of the D input at a definite portion of an input clock cycle, e.g., a rising edge or a falling edge, known as the capture time. That captured value becomes the Q output. The output Q does not change except at the capture time (or some small propagation delay thereafter). In practical implementations it is required that a data input D be stable for some setup time prior to the capture time and for some hold time after the capture time for the input to be reliably captured and propagated to the output. "Fan-in" describes the number of inputs a logic gate can handle. The larger the fan-in, the more inputs can be handled by the gate. Logic gates with higher fan-in can be employed in digital logic design to reduce the depth of a logic circuit, improving circuit efficiency and density.

Phase-mode logic allows digital values to be encoded as superconducting phases of one or more JJs. For example, a logical "1" may be encoded as a high phase and a logical "0" may be encoded as a low phase. For example, the phases may be encoded as being zero (meaning, e.g., logical "0") or $2\pi$ (meaning, e.g., logical "1"). These values persist across RQL clock cycles because there is no requirement for a reciprocal pulse to reset the JJ phase.

SUMMARY

One example includes a reciprocal quantum logic (RQL) gate circuit having an input stage having at least one logical input configured to be asserted based on receiving a positive single flux quantum (SFQ) pulse and an output stage having phase mode logic (PML) inverter circuitry. The input stage includes one or more storage loops. At least one of the storage loops is associated with each logical input. Each storage loop has an input Josephson junction (JJ), a storage inductor, and a logical decision JJ, the logical decision JJ being common to all the storage loops associated with the logical inputs. The logical decision JJ is configured to trigger based on biasing provided by one or more currents stored in the storage loops and an AC component of a first bias signal provided to the input stage. The PML inverter circuitry is configured to de-assert an output based on a triggering of the logical decision JJ. The output stage is provided with a second bias signal having an AC component that is 180° out of phase with the AC component of the first bias signal. For example, an AC component of the second bias signal can be 180° out of phase with an AC component of the first bias signal.

Another example includes a method of determining a logic value. One or more positive single flux quantum (SFQ) pulses are provided to assert one or more logical inputs of a reciprocal quantum logic (RQL) gate. One or more positive currents is thereby placed in one or more input storage loops in the RQL gate. A logical decision Josephson junction (JJ) is thereby triggered in the RQL gate. A de-assertion signal is thereby propagated from an output of the RQL gate. One or more negative SFQ pulses can then be provided to de-assert one or more of the (previously asserted) logical inputs. One or more negative currents can thereby be placed in one or more of the input storage loops. The logical decision JJ can thereby be untriggered, and an assertion signal can thereby be propagated from the output of the RQL gate.

Another example includes a circuit having one or more logical input Josephson transmission lines (JTLs) each connected to a dovetail node, each logical input JTL comprising a storage loop input inductor connected, at a first node, to an input JJ and a storage inductor, the storage loop input inductor, input JJ, and storage inductor being sized to provide unidirectional data flow. A logical decision JJ connects the dovetail node and a low-voltage node, such that respective storage loops are formed by the input JJ and storage inductor of each input JTL and the logical decision JJ. PML inversion circuitry connects the dovetail node and a logical output node to invert a logical decision made by the logical decision JJ. Two bias inputs provide the circuit bias signals having AC components that are about 180° out of phase with each other. The circuit is configured to provide a de-asserted or asserted logical output signal at the output node based on asserted or de-asserted logical input signals provided to the logical input JTLs.

BRIEF DESCRIPTION OF THE DRAWINGS

FIGS. 7A and 7B are flow diagrams of example methods of determining an inverted logical output from an RQL gate having at least one logical input based on single flux quantum (SFQ) pulse inputs.

DETAILED DESCRIPTION

This disclosure relates generally to logical gate circuits for use in reciprocal quantum logic (RQL) systems and related methods. This disclosure more specifically relates to such gates having inverting outputs, including inverting majority gates, NAND gates, NOR gates, inverting D flip-flops, and inverting OR-AND (OA) gates, among others.

Reciprocal quantum logic (RQL) logic gates can integrate a Josephson transmission line (JTL) into their output to provide the required amplification to drive a load. A phase mode logic (PML) inverter cell provides an inverting logic gate in the PML family. However, when providing a single-input inverting function such as an inverting D flip-flop (DFFN), or a multi-input inverting function like NAND, NOR, or an inverting majority gate, it may be structurally inefficient to use a non-inverting logic gate followed by an inverter gate. The present disclosure combines input logic and output inversion into a single cell by overlaying structures shared by both, thus permitting one JTL stage to act as both the output of the input logic and the input of an inverting stage to provide an inverted output.

Figure 1:
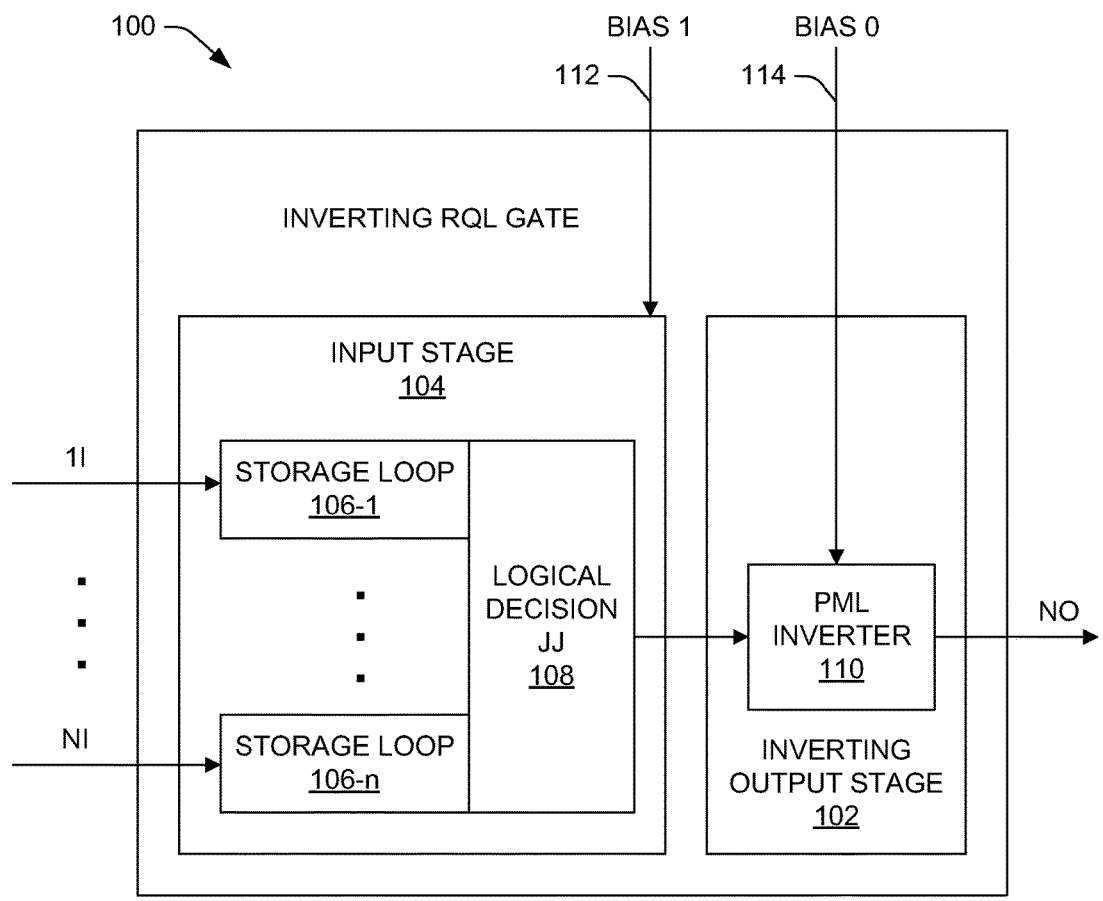
FIG. 1 is a block diagram of an example inverting reciprocal quantum logic (RQL) gate.

FIG. 1 shows inverting RQL gate 100 having at least one logical input 1I and output NO. Gate 100 can have number of logical inputs 1I through NI. Gate 100 includes inverting output stage 102, configured to provide inverted output NO, and input stage 104, configured to receive the one or more inputs 1I through NI, which can consist of positive or negative single flux quantum (SFQ) pulses corresponding to asserted or de-asserted logic states, respectively. Each input has associated with it at least one storage loop among storage loops 106-1 through 106-$n$. Although input stage 104 is illustrated as having one storage loop per input, each input can have more than one storage loop associated with it. Logical decision Josephson junction (JJ) 108 is common to (i.e., shared by) all logical input storage loops, and triggers based on one or more inputs 1I through NI. The assertion or de-assertion of output NO is based on the triggering of logical decision JJ 108. For example, output NO can propagate a negative SFQ pulse corresponding to a de-asserted output logic state and a positive SFQ pulse corresponding to an asserted output logic state. Output stage 102 includes a phase mode logic (PML) inverter to invert the output of logical decision JJ 108.

The triggering of logical decision JJ 108 can be based not only on inputs 1I through NI, but also on a bias signals 112 and 114 provided to input stage 104 and output stage 102, respectively. Bias signals 112, 114 can provide both AC and DC bias. Thus, for example, bias signals 112, 114 can act as a clock to RQL gate 100, causing the evaluation of the inputs 1I through NI to produce the output NO at certain points in time according to the AC component of bias signals 112, 114. The AC components of bias signals 112, 114 can be 180° out of phase with respect to each other.

Figure 2:
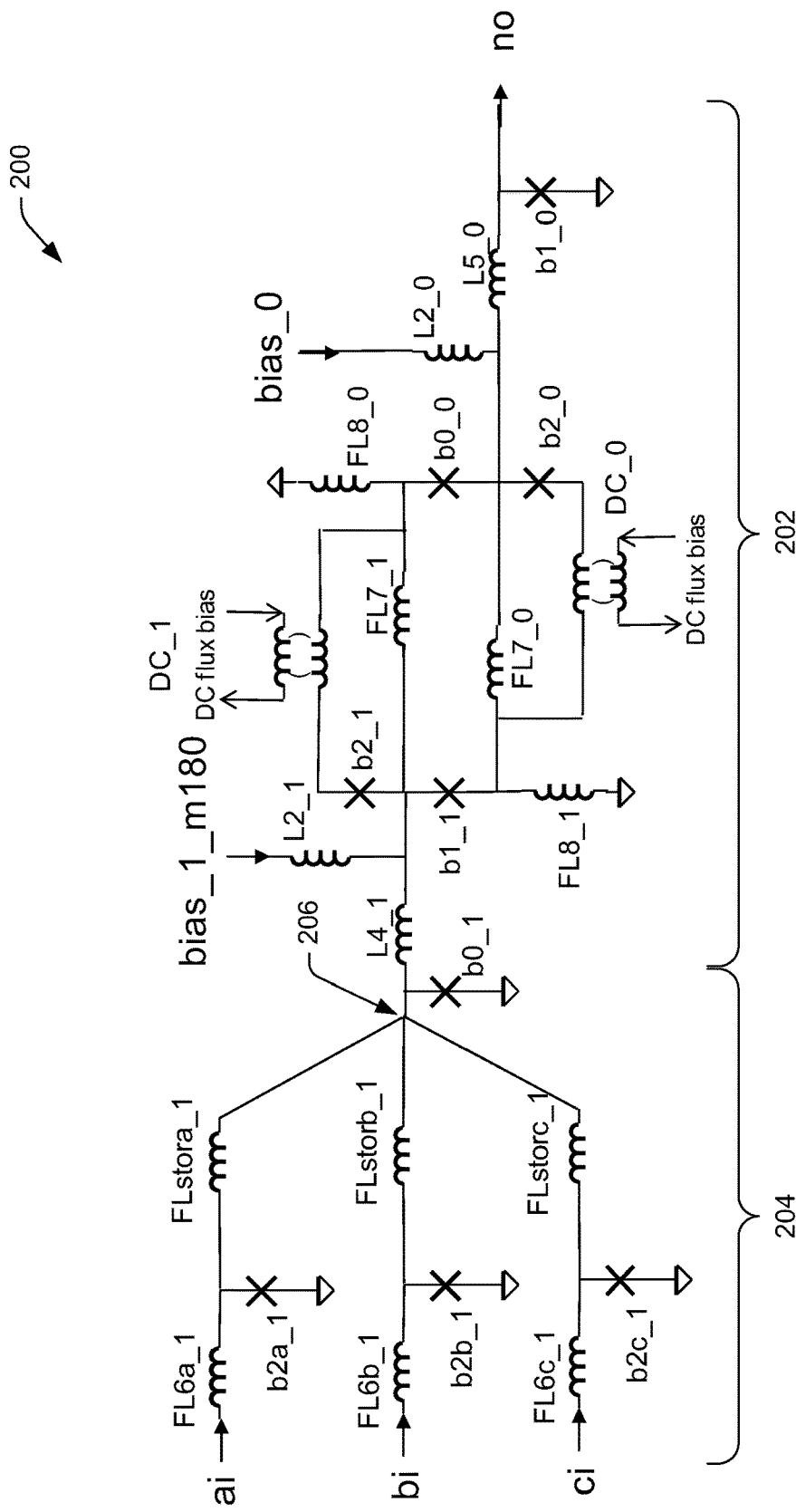
FIG. 2 is a circuit diagram of an example inverting 2-of-3 majority gate.

FIG. 2 illustrates an RQL gate that can have a number of configurations to provide a number of different logical functions. Specifically, the illustrated configuration provides an RQL inverting majority gate circuit 200, producing an asserted output only when a majority of the logical inputs are not asserted. More specifically, gate 200 is an inverting 2-of-3 majority gate, producing an assertion signal at output no only when one or none of inputs ai, bi, and ci is asserted. Gate circuit 200 has an inverting output stage 202 to provide signal inversion and amplification and an input stage 204 having a number of JTL input branches that join at dovetail node 206. Together with logical decision JJ b0_1, the input branches form storage loops to receive and store inputs until a logical decision can be made, i.e., until a logic condition is met.

In input stage 204, a separate input storage loop is associated with each input. Thus, for example, the input storage loop for input ai includes JJs b2a_1 and b0_1, as well as inductor FLstora_1. Leading inductor FL6a_1 allows input ai to be connected to a driving JTL or to the output of another gate. Logical decision JJ b0_1, which is common to all input storage loops, performs the logic operation of majority gate 200. The output of logical decision JJ b0_1 serves as the input of inversion stage 202.

The selections of component sizes in each storage loop in input stage 204 provide a unidirectional data flow. Circuit 200 operates on SFQ pulses, which each place one $\Phi_0$ (about 2.07 mA pH) of current into a storage loop. The magnitude of current through such a storage loop is determined by the size of the storage inductor in the storage loop. Thus, for each input, the inductance value of the storage loop input inductor (e.g., FL6a_1) can be small (e.g., between about 8 pH and 9 pH, e.g., 8.5 pH) in comparison to the inductance value of the storage inductor (e.g., FLstora_1). On the other hand, the storage inductor can sized to be relatively large (e.g., between about 30 pH and 40 pH, e.g., 35 pH) (e.g., about four times larger than the corresponding storage loop input inductor) to reduce the magnitude of the stored current induced by an input SFQ pulse. In some examples, the magnitude of a current introduced at an input (e.g., ai) is about four times larger than the current stored in a storage loop. The input JJ for input ai, b2a_1, is also sized such that the driving JTL is capable of flipping this JJ to put current into the storage loop, but the current in the storage loop is never sufficient to unflip input JJ b2a_1 and allow the stored pulse to back out of the input.

The storage loops associated with inputs bi and ci can have the same structure as the storage loop for input ai, all overlapping at logical decision JJ b0_1. Output no may also be connected to a JTL or to the input of another gate, for example, to propagate positive or negative output pulses representing the assertion or de-assertion of gate 200 to logical "high" or "low," respectively.

Logical decision JJ b0_1 performs the logic function of the input stage 204 of gate 200. The combination of any two inputs, plus the bias bias_1_$m_{13}$ 180, is sufficient to switch logical decision JJ b0_1 in either direction. As mentioned with respect to bias signal 112 in gate 100 of FIG. 1, an AC component (e.g., a sine wave component) of bias signal bias_1_m_180 in gate 200 of FIG. 2 can act as a clock signal to input stage 204, which can evaluate the logical inputs twice per cycle of the clock signal. The AC phase of bias signal bias_1_m180 can have alternating positive and negative portions. During the positive portion of the AC phase, input stage 204 evaluates inputs ai through ci to decide whether the output of input stage 204 should be asserted; during the negative portion of the AC phase, input stage 204 evaluates inputs ai through ci to decide whether the output of input stage 204 should be de-asserted.

The functioning of a single input branch of input stage 204 will now be described. An input pulse, e.g., a single flux quantum (SFQ) pulse, arriving at input ai induces a positive superconducting current through leading inductor FL6a_1 and input JJ b2a_1, which in turn triggers input JJ b2a_1, raising its superconducting phase to $2\pi$. The triggering of input JJ b2a_1 induces an equal and opposite current (e.g., one $\Phi_0$ worth of current) in leading inductor FL6a_1, annihilating the initial input current, and also induces a positive superconducting current in the loop formed by input JJ b2a_1, input loop storage inductor FLstora_1, and logical decision JJ b0_1. This storage loop current alone is insufficient to trigger logical decision JJ b0_1, and will remain trapped indefinitely in its storage loop if no further inputs are applied. A negative input pulse arriving at input ai would reverse the above-described effects, annihilating the positive storage loop current and returning the circuit to its initial state. Inputs bi and ci operate in exactly the same manner, as they are perfectly symmetrical with input ai.

Storage loop current from one input alone is insufficient to trigger logical decision JJ b0_1, even with the AC and DC bias bias_1_m180, because of the majority structure of input stage 204. The additional load presented to logical decision JJ b0_1 by the components associated with unasserted inputs bi and ci inhibits logical decision JJ b0_1 from triggering. Thus, assertion of a majority of inputs are required to cause b0_1 to trigger.

The functioning of input stage 204 will now be described for the condition when a majority of the inputs are asserted, i.e., when positive currents associated with at least two input branches circulate in storage loops associated with at least two inputs, each input having been asserted in the manner described above. Loop currents in the storage loops induced by positive input pulses at respective inputs will persist until subsequent negative pulses on the respective inputs remove them, or until the clocking function of the AC component of bias signal bias_1_m180 triggers logical decision JJ b0_1 to transform the inputs into a logic decision. Because of this storage functionality, inputs needed to amount to a majority number of input assertions need not arrive within the same clock cycle.

The majority of asserted inputs bias logical decision JJ b0_1 towards a positive transition, but due to the size of input loop storage inductors FLstora_1, FLstorb_1, and FLstorc_1, the storage loop currents are insufficient to cause this transition without additional bias current provided by the AC and DC bias bias_1_m180. When the AC bias component has reached sufficient positive magnitude, i.e., when input stage 204 of gate 200 is positively "clocked," logical decision JJ b0_1 triggers. Stored positive currents in input loop storage inductors are annihilated by the resulting pulse coming out of logical decision JJ b0_1. The triggering also induces currents in any storage loops associated with inputs that were not asserted, but such currents are negative currents, i.e., in the opposite direction of storage loop currents induced by input assertion signals. Additionally, a current is driven through inductor L4_1 into output stage 202 to be inverted. The inverted signal is propagated as an output signal out of the output no of gate 200. Since all inputs are symmetric, this same series of events can happen with any combination of two or more asserted inputs to drive the output no of gate 200 logical "low," giving the correct logical function for asserting the output of an inverting 2-of-3 majority gate.

Any negative currents induced in unasserted inputs bias logical decision JJ b0_1 towards a negative transition, but not sufficiently to cause the transition alone, even with the AC and DC bias bias_1_m180. This puts input stage 204 in the correct state to perform the correct logical function for de-asserting the output of input stage 204. Negative pulses arriving at any of the initially asserted inputs will provide negatively biasing currents in at least two of the three storage loops, such that in combination with the AC and DC bias bias_1_m180 they will unflip logical decision JJ b0_1 by causing it to transition out of its $2\pi$ phase, thereby de-asserting the output of input stage 204 back to logical "low." This will occur when the AC bias has reached sufficient negative magnitude, i.e., on the negative portion of the AC bias component of bias signal bias_1_m180. If, instead, a positive input were to arrive at an input not previously asserted, it would annihilate the respective stored negative current and negative input pulses would be required at any two of the previously asserted inputs before de-asserting the output of input stage 204 and thus asserting the output no of gate 200, again providing the correct function for an inverting 2-of-3 majority gate.

Inverting output stage 202 includes a phase mode logic inverter. The functionality of inverting output stage 202 can be understood with reference to the PML inverter gate 600 shown in FIG. 6, which inverts a positive SFQ pulse at input ai into a negative SFQ pulse at inverting output no. In circuit 600, input inductor L3_1 substitutes for the storage inductors FLstora_1, FLstorb_1, and FLstorc_1 shown in circuit 200 FIG. 2. The output no of gate 600 is propagated in response to an input ai substantially immediately, e.g., within just a few picoseconds of receipt of an input pulse. Two bias signals having AC components 180° out of phase with each other are provided to circuit 600, one at the input side, bias_1_m180, and one at the output side, bias_0. At its input JJs b0_1 and b1_1 and inductors L2_1 and FL4_1 form a JTL-like structure that is provided "positive" power by bias_1_m180 at the same time that "negative" power is provided by bias_0 to a similar JTL-like structure mirrored at the output by JJs b1_0 and b0_0 and inductors L2_0 and FL5_0. (Inductor FL4_1 corresponds to inductor L4_1 in FIGS. 2-4 and to inductor FL4_1 in FIG. 5.) In gate 600, a positive pulse received at input ai propagates through the positive-power input half, is flipped into a negative pulse where the JTL-like input and output structures meet, using a floating ground reference, and is immediately handed off to the negative-power output half at the same time for propagation of the negative pulse out of output no. DC flux bias lines 602, 604 provide a bias offset to enable the pulse flipping and to generate an initializing positive SFQ output pulse at circuit power-up, so that the output starts at a logical "high" when the input begins at logical "low." The functioning of such DC flux bias line is described in greater detail below with respect to NOR gate 400 shown in FIG. 4.

Gate 200 in FIG. 2 performs the combined function of a 2-of-3 majority gate with inverted output (minority gate). The combined reduces the number of circuit components required by two JJs, four inductors, and one AC and DC bias transformer. Larger fan-in inverting gates, such as an inverting 3-of-5 majority gate, an inverting 4-of-7 majority gate, etc., can be constructed by providing additional input branches dovetailing at node 206 and sizing components such that logical decision JJ b0_1 is biased to trigger only upon an majority of asserted inputs regardless of the number of input branches.

Gate 200 can serve as the basis for two-input logic gates such as NAND and NOR gates. Grounding one of the inputs (effectively tying it to logical "low") creates a two-input NAND gate with the remaining two inputs. Alternatively, using a DC bias to induce one $\Phi_0$ i.e., one SFQ pulse) of current on one of the inputs (effectively tying it to logical "high") creates a two-input NOR gate from the remaining two inputs.

Figure 3:
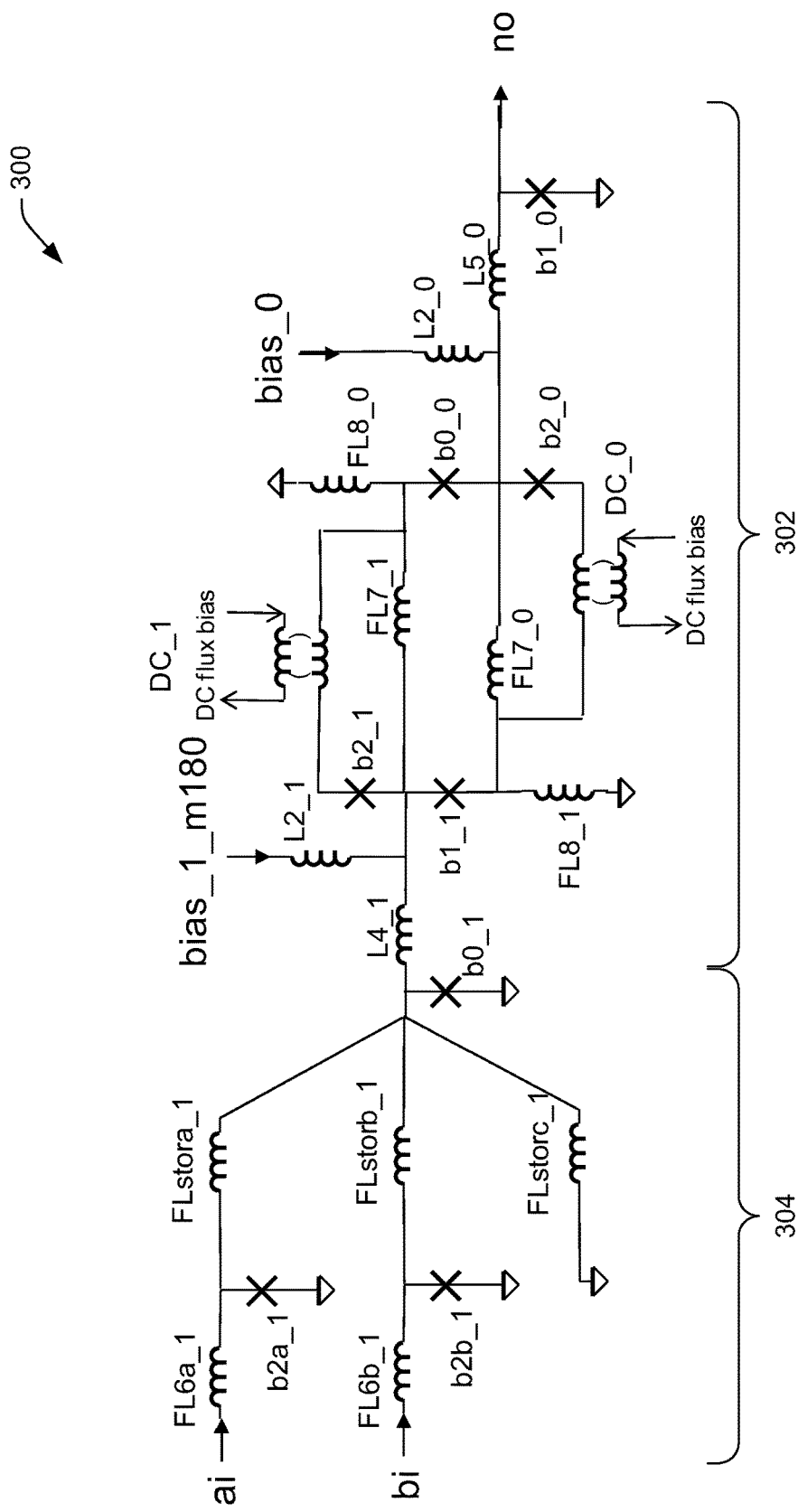
FIG. 3 is a circuit diagram of an example two-input NAND gate.

FIG. 3 shows an example NAND gate 300, specifically, a NAND2 gate (i.e., a two-input NAND gate) that is similar in configuration to the inverting majority gate of FIG. 2, but with the third input ci from FIG. 2 effectively tied to logical "low" by connecting it to a low-voltage rail (e.g., grounding it). Consequently, leading inductor FL6c_1 and input JJ b2c_1 from FIG. 2 are eliminated in input stage 304 of gate 300.

In NAND gate 300 of FIG. 3, once logical decision JJ b0_1 triggers in response to asserted inputs ai and bi, positive currents in storage inductors FLstora_1 and FLstorb_1 are destroyed, a negative current is induced into substitute storage inductor FLstorc_1, and a positive current is propagated into the output stage 302 for inversion as output no. Thereafter, if any negative pulses are applied to de-assert any previously asserted inputs among logical inputs ai and bi, one or more negative currents stored in any of the storage loops associated with the logical inputs combines with the negative current stored in substitute storage inductor FLstorc_1 to bias logical decision JJ b0_1 to untrigger upon the next negative portion of the AC component of the bias signal bias_1_m180, which in turn propagates a negative pulse out of into output stage 302 and thus asserts output no.

Figure 4:
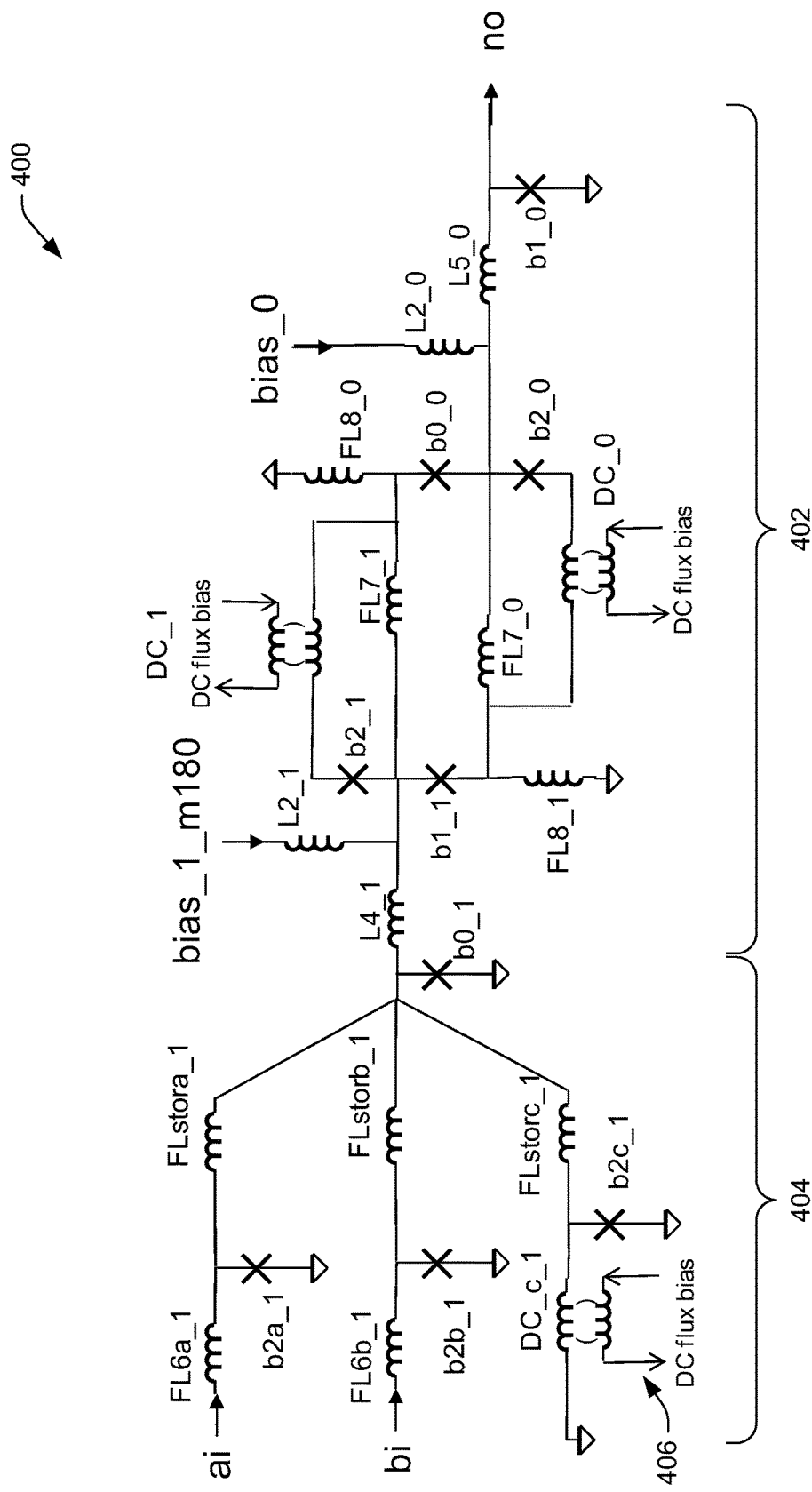
FIG. 4 is a circuit diagram of an example two-input NOR gate.

FIG. 4 shows an example NOR gate 400, specifically, a NOR2 gate (i.e., a two-input NOR gate), which is modified from the example majority gate 200 in a similar fashion to the two-input NAND gate 300 of FIG. 3, but introduces an additional JJ, bias quantizing JJ b2c_1, between transformer-coupled input inductor DC_c_1 and substitute storage inductor FLstorc_1. In NOR gate 400, output no is de-asserted if either or both of logical inputs ai or bi is asserted. Transformer-coupled input inductor DC_c_1 is transformer-coupled to DC flux bias line 406. Bias quantizing JJ b2c_1 quantizes the DC bias current supplied through DC bias DC_c_1 and improves operating margins.

DC current provided through DC flux bias line 406 stays constant throughout system operation. At system start-up, the DC current through DC flux bias line 406 couples current into input inductor DC_c_1 to which it is transformer-coupled, via the AC transient that occurs at system power-up. This triggers bias quantizing JJ b2c_1 once at the beginning of operation, putting a positive current into substitute storage inductor FLstorc_1, which contributes to the biasing of logical decision JJ b0_1 just as much as biasing from either of the logical inputs ai, bi.

Upon assertion of either of the logical inputs ai, bi, logical decision JJ b0_1 in input stage 404 of NOR gate 400 of FIG. 4 then effectively sees "two" out of "three" inputs asserted, one of the "two" inputs being the asserted logical input and the other of the "two" asserted inputs being the non-logical, phantom "input" initiated by the DC bias. Logical decision JJ b0_1 therefore triggers in response to at least one asserted input among logical inputs ai, bi. Upon such triggering, the positive current in substitute storage inductor FLstorc_1 is destroyed, b2c_1 does not untrigger, positive currents in storage inductors FLstora_1 and/or FLstorb_1 are destroyed should the inputs associated with those storage inductors have been asserted, negative currents are induced in the storage inductors associated with any unasserted inputs, and a positive current is propagated into output stage 402. The inverting action of output stage 402 consequently provides a de-asserted signal at output no in FIG. 4.

Thereafter, if negative pulses are applied to de-assert all of previously asserted inputs among logical inputs ai and bi, the negative currents stored in the storage loops associated with the logical inputs combine to bias logical decision JJ b0_1 to untrigger upon the next negative portion of the AC component of the bias signal bias_1_m180, which in turn propagates a negative pulse into output stage 402 and a positive pulse out of output no. This untriggering of logical decision JJ b0_1 restores the positive current to substitute storage inductor FLstorc_1, bringing the circuit back to its initial state, i.e., the state following start-up injection of initial positive current into substitute storage inductor FLstorc_1 via DC flux bias line 406.

Larger fan-in inverting gates, such as 3-input NAND and NOR gates, can be constructed by providing additional input dovetailing branches and sizing components such that logical decision JJ b0_1 is biased to trigger only upon appropriate input assertion conditions, regardless of the number of input branches. Similarly, an inverting OA21 gate can constructed by modifying a 3-of-5 majority gate input stage instructure to provide one input to two parallel branches, or to a single branch having doubled JJ sizes and halved inductor sizes, and by effectively tying one of the five inputs to logical "low" by connecting it to a low-voltage rail (e.g., ground).

Figure 5:
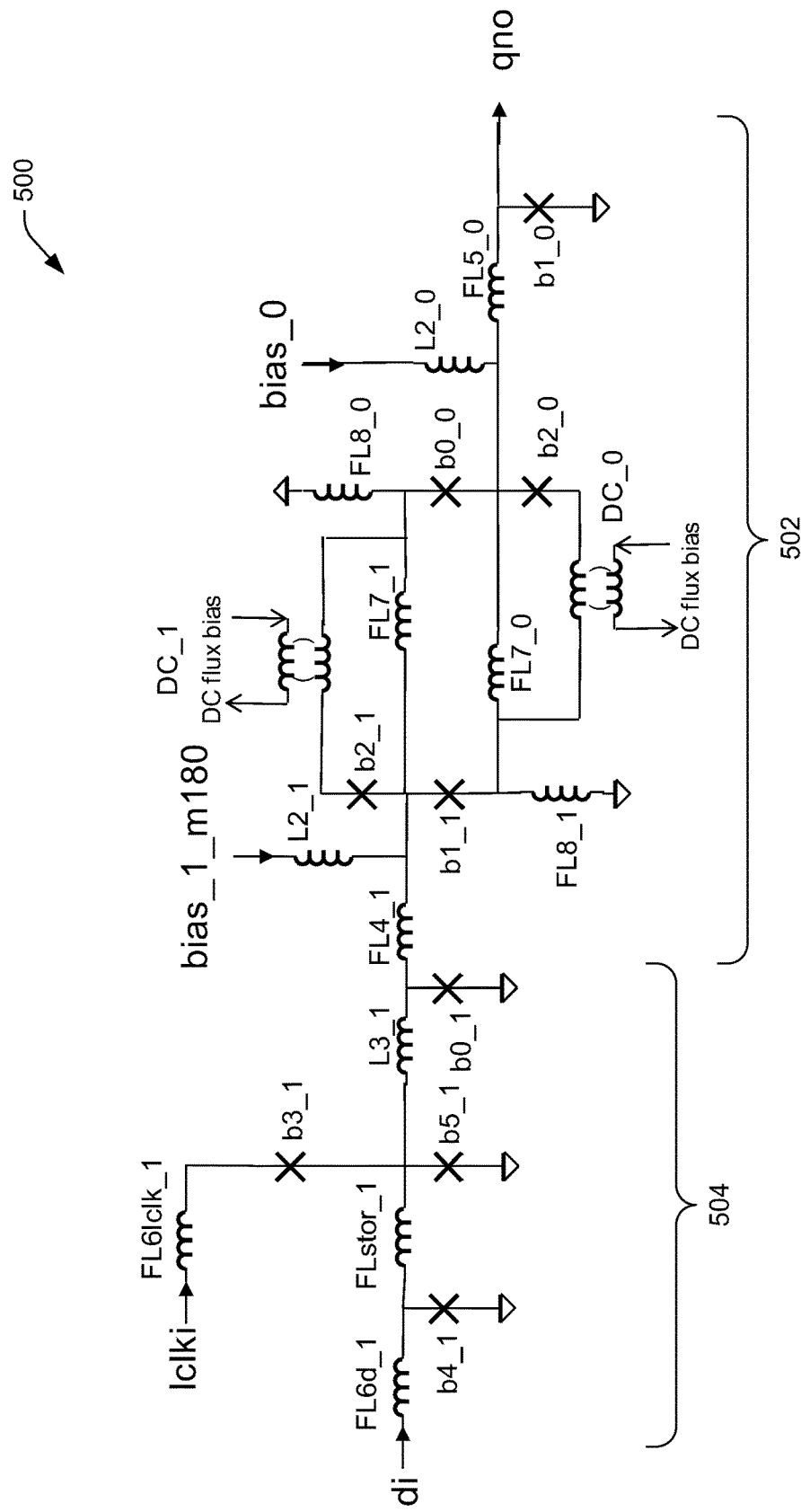
FIG. 5 is a circuit diagram of an example inverting D flip-flop (DFFN) gate.
Figure 6:
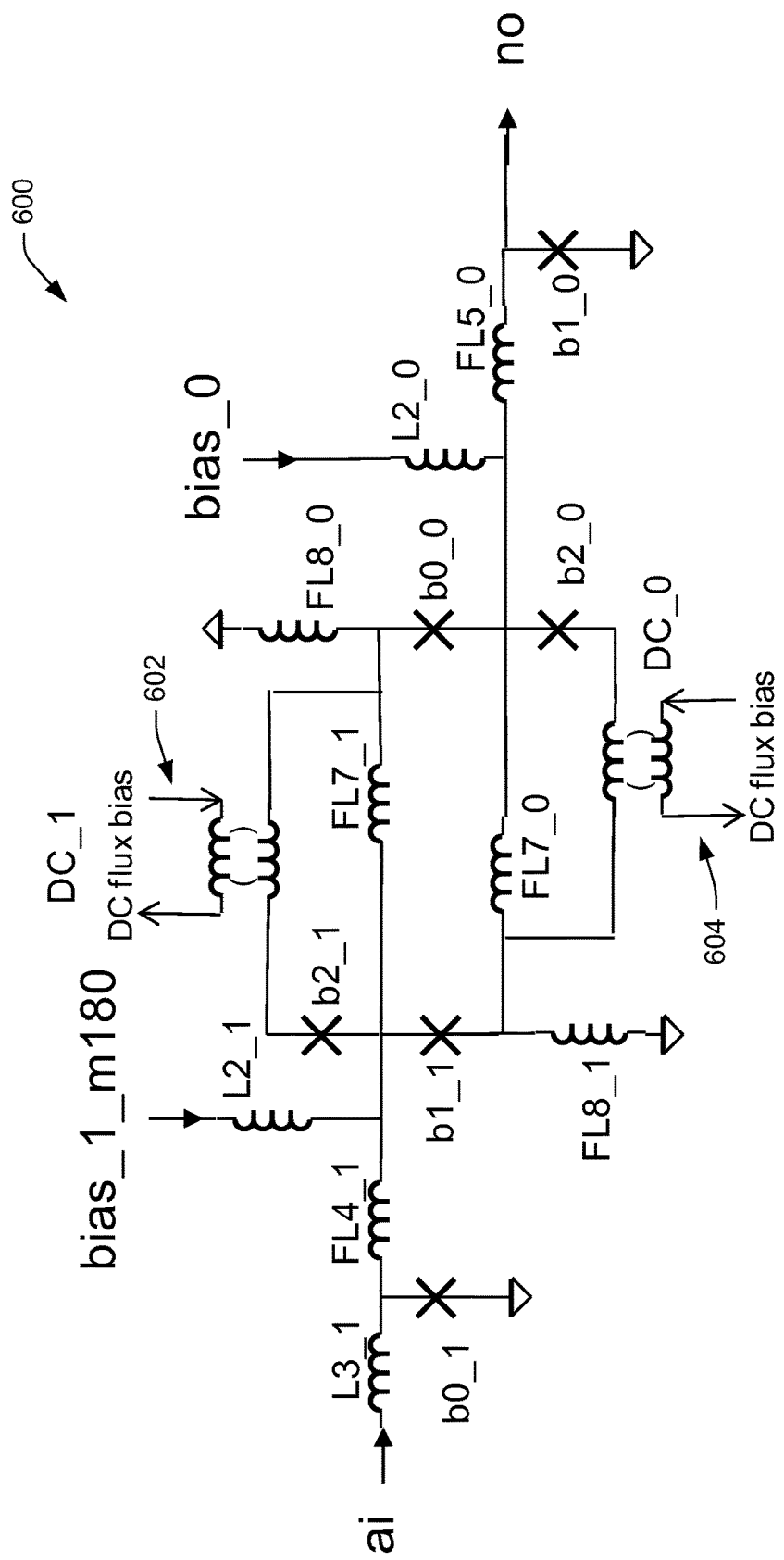
FIG. 6 is a circuit diagram of an example phase-mode logic (PML) inverter.

FIG. 5 shows an example D flip-flop with inverted output (DFFN) 500 having an inverting output stage 502 like the inverting output stages 202, 302, 402 of any of the previous examples and an input stage 504 providing the functionality of a D flip-flop. With circuit 500, the logical inverse of an input signal provided at input di is issued from output qno based upon logical clock signal lclki as well as the clocking function of the AC component of bias signal bias_1_m180. Logical clock input lclki provides the equivalent of an AC clock CLK in a CMOS flip-flop. Logical clock input lclki can provide an SFQ signal, e.g., a return-to-zero (RZ) pulse pair, and should not be confused with an RQL clock that may be used to provide reciprocal clock signals in an RQL system.

An asserted input signal from data input di triggers data input JJ b4_1 in circuit 500 and stores a superconducting current in a storage loop formed by data input JJ b4_1, storage inductor FLstor_1, and JJ b5_1. Owing to the comparatively large size of storage inductor FLstor_1, the current stored there will not be enough to trigger JJ b5_1 on its own. Thus, an lclki signal is required to "clock" the input di by triggering JJ b5_1 (JJ b5_1 having been biased toward triggering by current in the storage loop) and thus to trigger logical decision JJ b0_1. Output stage 502 works to invert the asserted input signal into a de-asserted output signal at output qno as described in regard to previous examples 200, 300, and 400.

In some examples, comparator JJs b3_1 and b5_1 can each be configured to exhibit critical currents between 30 microamperes and 55 microamperes, e.g., between 35 microamperes and 50 microamperes. Data input JJ b4_1 may be configured to exhibit a critical current at a larger current, e.g., between 55 microamperes and 65 microamperes, e.g., 60 microamperes. Storage inductor FLstor_1 may be configured to have an inductance value between 25 picohenries (pH) and 40 pH, e.g., between 30 pH and 35 pH. Comparator JJs b3_1 and b5_1 can be configured to exhibit critical currents similar to each other. Comparator JJs b3_1 and b5_1 need not exhibit critical currents at exactly the same currents, but comparator JJs b3_1 and b5_1 can be close in critical current size to one another, e.g., within 10% of each other. Escape JJ b3_1 can be configured to have a smaller critical current than output JJ b5_1.

In all of the above examples 200, 300, 400, and 500 the input JJ of PML inverter circuitry (e.g., b0_1 of circuit 600 in FIG. 6) is used to perform an additional logic decision function. Using the input JJ of PML inverter circuitry to perform an additional logic decision function reduces component count, increases circuit efficiency, reduces propagation delay times of inverting circuits, and reduces complexity and cost.

FIG. 7A shows method 700 of determining an inverted logical output from an RQL gate having at least one logical input based on SFQ pulse inputs. One or more positive SFQ pulses are provided 702 to assert one or more logical inputs of an RQL gate having at least one logical input to place 704 one or more currents in one or more input storage loops associated with the asserted inputs, e.g., one loop per input.

The RQL gate can be, for example, like any of gates 100, 200, 400, 500, or 600 shown in FIGS. 1-6, or can be extensions of such examples providing a greater number of inputs and/or combining or splitting input storage loop branches, as discussed previously. A JJ that is configured to trigger based on the assertion of a certain number of the logical inputs, or certain ones of the logical inputs, or upon assertion of a logical input during a part of a logical clock pulse as in the case of a DFFN gate, then triggers 706. The JJ can be so configured, for example, by making it common to all of the input storage loops, by effectively tying to logical "high" or logical "low" additional inputs not counted among the logical inputs, by providing appropriate biasing, and/or by appropriate component sizing. A de-assertion signal, generated as a result of the triggering, then propagates 708 from an output of the RQL gate. The de-assertion signal can result from an inversion of a signal resulting from the triggering of the logical decision JJ. For example, the inversion can be provided by PML inverter circuitry. The de-assertion signal can be, for example, a single negative SFQ pulse.

FIG. 7B shows method 750 of determining a logical output from an RQL gate based on SFQ pulse inputs, which can continue from method 700 shown in FIG. 7A. Negative SFQ pulses are provided 710 to de-assert one or more logical inputs of an RQL gate to place 712 one or more currents in one or more input storage loops associated with the asserted inputs, e.g., one loop per input, where the gate has more than two such storage loops. The placed currents can be negative currents, i.e., currents equal and opposite to the currents placed 704 in method 700. Again, the RQL gate can be, for example, like any of gates 100, 200, 400, 500, or 600 shown in FIGS. 1-6, or can be extensions of such examples providing a greater number of inputs and/or combining or splitting input storage loop branches, as discussed previously. A JJ that is configured to untrigger based on the de-assertion of a certain number of the logical inputs, or certain ones of the logical inputs, or upon de-assertion of a logical input during a part of a logical clock pulse as in the case of a DFFN gate, then untriggers 714. The JJ can be so configured, for example, by making it common to all of the input storage loops, by effectively tying to logical "high" or logical "low" additional inputs not counted among the logical inputs, by providing appropriate biasing, and/or by appropriate component sizing. An assertion signal, generated as a result of the triggering, then propagates 716 from an output of the RQL gate. The de-assertion signal can be, for example, a single negative SFQ pulse, opposite in direction to the pulse propagated 708 in method 700.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A reciprocal quantum logic (RQL) gate circuit comprising:
    an input stage having at least one logical input configured to be asserted based on receiving a positive single flux quantum (SFQ) pulse, the input stage comprising one or more storage loops, at least one of the storage loops being associated with each logical input, each of the storage loops comprising an input Josephson junction (JJ), a storage inductor, and a logical decision JJ, the logical decision JJ being common to all the storage loops associated with the logical inputs and being configured to trigger based on biasing provided by one or more currents stored in the storage loops and a first bias signal having a first state provided to the input stage; and
    an output stage comprising phase mode logic (PML) inverter circuitry configured to de-assert an output based on a triggering of the logical decision JJ, the output stage being provided with a second bias signal having a second state that is opposite of the first state.

2. The circuit of claim 1, wherein the output stage is further configured to assert the output based on the untriggering of the logical decision JJ.

3. The circuit of claim 1, wherein the input stage has exactly three logical inputs, and the output stage is configured to de-assert the output based on assertion of at least two of the logical inputs.

4. The circuit of claim 1, wherein the input stage has exactly five logical inputs, and the output stage is configured to de-assert the output based on assertion of at least three of the logical inputs.

5. The circuit of claim 1, wherein the input stage has exactly two logical inputs, and the output stage is configured to de-assert the output based on assertion of both of the logical inputs.

6. The circuit of claim 1, wherein the input stage has exactly two logical inputs, and the output stage is configured to de-assert the output based on assertion of one or both of the logical inputs.

7. The circuit of claim 1, wherein the input stage further comprises a logical clock input configured to provide a logical clock input as return-to-zero (RZ) SFQ pulse pairs, and wherein the input stage is configured to trigger the logical decision JJ based on a logical input and the logical clock input.

8. The circuit of claim 1, wherein the output stage includes no more than five JJs, exclusive of the logical decision JJ.

9. The circuit of claim 8, wherein the output stage further comprises two transformer-coupled DC flux bias lines configured to provide an assertion signal at the output at power-up of the RQL gate circuit.

10. The circuit of claim 9, wherein the output stage includes no more than eight inductors, exclusive of inductors used to transformer-couple the DC flux bias lines to the output stage.

11. A method of determining a logic value comprising:
    providing one or more positive single flux quantum (SFQ) pulses to assert one or more logical inputs of a reciprocal quantum logic (RQL) gate;
    based on the providing, placing one or more positive currents in one or more input storage loops in the RQL gate;
    based on the placing, triggering a logical decision Josephson junction (JJ) in the RQL gate; and based on the triggering, propagating a de-assertion signal from an output of the RQL gate.

12. The method of claim 11, further comprising, after the propagating:
providing one or more negative SFQ pulses to de-assert one or more of the logical inputs;
based on the providing the one or more negative SFQ pulses, placing one or more negative currents in one or more of the input storage loops;
based on the placing the one or more negative currents, untriggering the logical decision JJ; and
based on the untriggering, propagating an assertion signal from the output of the RQL gate.

13. The method of claim 11, further comprising providing two bias signals each having an AC component 180° out of phase with each other, and wherein the triggering is further based on one of the bias signals and a signal inversion is based on the bias signals.

14. A circuit comprising:
one or more logical input Josephson transmission lines (JTLs) each connected to a dovetail node, each logical input JTL comprising a storage loop input inductor connected, at a first node, to an input Josephson junction (JJ) and a storage inductor, the storage loop input inductor, input JJ, and storage inductor being sized to provide unidirectional data flow;
a logical decision JJ connected between the dovetail node and a low-voltage node, such that respective storage loops are formed by the input JJ and storage inductor of each input JTL and the logical decision JJ;
phase mode logic (PML) inversion circuitry connecting the dovetail node and a logical output node to invert a logical decision made by the logical decision JJ; and
two bias inputs providing bias signals having AC components that are about 180° out of phase with each other,
wherein the circuit is configured to provide a de-asserted or asserted logical output signal at the output node based on asserted or de-asserted logical input signals provided to the logical input JTLs.

15. The circuit of claim 14 having three logical input JTLs that intersect at the dovetail node, wherein the output signal provides an inverting 2-of-3 majority function based on the logical input signals provided to the three logical input JTLs.

16. The circuit of claim 15 having no more than nine JJs.

17. The circuit of claim 14 having two logical input JTLs that intersect at the dovetail node along with an inductor between the dovetail node and a low-voltage rail, wherein the output signal provides a NAND function based on the logical input signals provided to the two logical input JTLs.

18. The circuit of claim 17 having no more than eight JJs.

19. The circuit of claim 14 having two logical input JTLs that intersect at the dovetail node along with an inductor between the dovetail node and a bias quantizing JJ configured to quantize a DC flux bias current supplied through a transformer-coupled input inductor at system start-up, wherein the output signal provides a NOR function based on the logical input signals provided to the two logical input JTLs.

20. The circuit of claim 14 having exactly one logical input JTL connected to the dovetail node, the logical input JTL having a logical clock input configured to provide an SFQ signal as a return-to-zero (RZ) pulse pair, and wherein the output signal provides an inverted-output D flip-flop function based on the logical input signal provided to the one logical input JTLs.

* * * * *